United States Patent
Ke et al.

(10) Patent No.: US 7,355,279 B2
(45) Date of Patent: Apr. 8, 2008

(54) SEMICONDUCTOR DEVICE AND FABRICATION METHOD THEREOF

(75) Inventors: Chun-Chi Ke, Taichung Hsien (TW); Kook-Jui Tai, Taichung (TW); Chien-Ping Huang, Hsinchu Hsein (TW)

(73) Assignee: Siliconware Precision Industries Co., Ltd. (TW)

( * ) Notice: Subject to any disclaimer, the term of this patent is extended or adjusted under 35 U.S.C. 154(b) by 302 days.

(21) Appl. No.: 11/226,707

(22) Filed: Sep. 13, 2005

(65) Prior Publication Data

US 2006/0258137 A1 Nov. 16, 2006

(30) Foreign Application Priority Data

May 12, 2005 (TW) .............................. 94115340 A

(51) Int. Cl.
*H01L 23/48* (2006.01)
(52) U.S. Cl. ...................................... 257/737; 257/738

(58) Field of Classification Search ................ 257/737, 257/738, 779; 438/613
See application file for complete search history.

(56) References Cited

U.S. PATENT DOCUMENTS 7,012,334 B2 * 3/2006 Liu et al. ..................... 257/737

* cited by examiner

*Primary Examiner*—Mark V. Prenty
(74) *Attorney, Agent, or Firm*—Peter F. Corless; Steven M. Jensen; Edwards Angell Palmer & Dodge LLP

(57) ABSTRACT

A semiconductor device and a fabrication method thereof are provided. A semiconductor substrate having a plurality of bonding pads is prepared, and a first passivation layer, a second passivation layer and a metallic layer are successively formed on the semiconductor substrate. A third passivation layer is further applied on the semiconductor substrate and has a plurality of openings for exposing a portion of the metallic layer, wherein each of the openings is shifted in position from a corresponding one of the bonding pads by a distance not exceeding a radius of the bonding pad. A plurality of solder bumps are bonded to the exposed portion of the metallic layer and have a larger contact area with the third passivation layer. This provides better buffer to reduce stress exerted on the solder bumps, thereby preventing problems of cracking and delamination as in the prior art.

14 Claims, 6 Drawing Sheets

SEMICONDUCTOR DEVICE AND FABRICATION METHOD THEREOF

FIELD OF THE INVENTION

The present invention relates to semiconductor devices and fabrication methods thereof, and more particularly, to a semiconductor device with solder bumps bonded thereon, and a fabrication method of the semiconductor device.

BACKGROUND OF THE INVENTION

Due to the progress of semiconductor fabrication technology and the improvement of electrical performance on semiconductor devices, along with increasing demands for various kinds of portable products in the fields of communications, networks and computers, semiconductor packaging technology such as Ball Grid Array (BGA), Flip Chip and Chip Size Package (CSP), which can reduce the size of a semiconductor package having higher pin counts, has become the mainstream.

For the flip-chip semiconductor package, a plurality of solder bumps are implanted on a plurality of bonding pads formed on a semiconductor substrate such as a wafer or a chip, and the solder bumps are electrically connected to a carrier such as a substrate directly. Compared to a wire-bonding method, the flip-chip semiconductor package has a shorter circuit path and is better in electrical performance, and further the flip-chip semiconductor package has enhanced heat dissipating performance when a back side of the chip thereof is exposed to the ambient.

As disclosed in U.S. Pat. Nos. 6,111,321, 6,229,220, 6,107,180, and 6,586,323, an Under Bump Metallurgy (UBM) is formed before forming a solder bump on a semiconductor substrate such as a chip when using the flip-chip technology, so as to bond the solder bump to the chip via the UBM. However, when the solder bump on the chip is electrically connected to a substrate directly, stress resulted from CTE (coefficient of thermal expansion) mismatch between the chip and the substrate would be imposed on the solder bump and the UBM, thereby causing cracking of the solder bump or delamination of the solder bump from the UBM. As a result, the electrical performance and reliability of the semiconductor package are adversely affected. To eliminate the aforementioned problems, as described in U.S. Pat. Nos. 5,720,100, 6,074,895, and 6,372,544, an underfill material is utilized to fill a gap between the chip and the substrate so as to alleviate the stress exerted to the solder bump and the UBM. However, the underfilling process alone is not satisfactory in eliminating the aforementioned problems and is time-consuming to carry out.

Another approach for solving the cracking and delamination issues is referred to as Re-Passivation, which is a method for forming on a passivation layer of the semiconductor substrate a dielectric layer made of such as benzocyclo-butene (BCB) or polyimide (PI), prior to the formation of the UBM. By the dielectric layer, the stress exerted to the solder bump and the UBM can be reduced. The re-passivation method is illustrated with reference to FIGS. 1A to 1E.

As shown in FIG. 1A, firstly, a semiconductor substrate 10 having a plurality of bonding pads 11 (I/O connections) is covered by a passivation layer 12 having a plurality of openings for partly exposing each of the bonding pads 11. For the purpose of simplifying illustration, merely a bonding pad 11 on the semiconductor substrate 10 is depicted in each of the accompanying drawings. Then, as shown in FIG. 1B, a dielectric layer 13 made of such as polyimide is formed over the passivation layer 12 and exposes the bonding pad 11. As shown in FIG. 1C, a UBM 14 is formed on the bonding pad 11 by a sputtering or plating technique. Then, as shown in FIG. 1D, a solder mask 15 such as a dry film is coated on the dielectric layer 13, leaving the UBM 14 exposed in order to coat a solder material 16 on the exposed UBM 14. Finally, after in turn performing a first reflow process on the solder material 16, removing the solder mask 15, and performing a second reflow process on the solder material 16, a solder bump 17 as shown in FIG. 1E is thus obtained.

The foregoing problems of cracking and delamination can be reduced by the above arrangement when a line width between circuits formed in the semiconductor substrate is not smaller than 0.13 μm. This is because the dielectric layer 13 formed between the UBM 14 and the passivation layer 12 is capable of absorbing the stress exerted to the UBM 14 and the solder bump 17. However, when the line width is smaller than 90 nm or even reduced to 65 nm, 45 nm or 32 nm, to overcome the resistance/capacity (RC) time delay induced by the reduction of line width, a dielectric material with low dielectric constant (low K) should be introduced to form the dielectric layer 13. By the use of the dielectric material with low dielectric constant, metal circuits formed in the semiconductor substrate can be closely arranged, such that signal leakage and interference can be prevented and the transmission speed can also be relatively enhanced. However, the dielectric material with the low K feature is hard and crisp in nature such that delamination of the dielectric layer may easily occur and the electrical performance is adversely affected. It is mainly because the stress is still primarily exerted to an interface between the solder bump 17 and the UBM 14, whereas the dielectric layer 13 formed under the UBM 14 can only relieve a portion of the stress in a lateral direction. As the dielectric layer 13 fails to provide sufficient buffer to alleviate the stress, cracking of the solder bump 17 or delamination of the UBM 14 may still occur.

Accordingly, as described in U.S. Pat. Nos. 6,492,198, 6,287,893, and 6,455,408, a Re-Distribution technology is developed to solve the above-mentioned problems, which involves the use of a re-distribution layer (RDL) for forming conductive circuits. By way of the re-distribution technology, bonding pads on a semiconductor substrate can be re-distributed to predetermined positions that allow better formation of UBMs thereon. Typically, a dielectric layer is formed under solder bumps in the re-distribution process, so as to allow the dielectric layer to provide certain buffer against the stress and thereby prevent cracking of the solder bumps or delamination of the UBMs. However, the performance of re-distribution process increases complexity, difficulty and costs of the overall fabrication processes, and problems such as parasitic capacitance arise due to the re-distribution of conductive circuits, which accordingly adversely affect the electrical performance of the semiconductor substrate.

SUMMARY OF THE INVENTION

To overcome the above-mentioned problems of the prior art, it is a primary objective of the present invention to provide a semiconductor device and a fabrication method thereof for effectively preventing cracking of solder bumps and delamination of UBMs.

It is another objective of the present invention to provide a semiconductor device and a fabrication method thereof for allowing the use of a dielectric material with low K dielectric layer without adversely affecting the reliability of the semiconductor device.

It is still another objective of the present invention to provide a semiconductor device and a fabrication method thereof for avoiding a parasitic capacitance problem.

It is a further objective of the present invention to provide a semiconductor device and a fabrication method thereof without the need of a re-distribution process.

To achieve the above-mentioned and other objectives, a semiconductor device is provided according to a preferred embodiment of the present invention, which comprises: a semiconductor substrate having a plurality of bonding pads; a first passivation layer and a second passivation layer formed in a stack manner on the semiconductor substrate, with the bonding pads being exposed from the first and second passivation layers; a metallic layer formed on each of the bonding pads and covering a portion of the second passivation layer surrounding each of the bonding pads; a third passivation layer applied on the second passivation layer and having a plurality of openings for exposing a portion of the metallic layer, wherein each of the openings is shifted in position from a corresponding one of the bonding pads by a distance not exceeding a radius of the corresponding one of the bonding pads; and a plurality of solder bumps bonded to the portion of the metallic layer exposed via the openings.

In another preferred embodiment, a semiconductor device is provided according to the present invention, which comprises: a semiconductor substrate having a plurality of bonding pads; a first passivation layer and a second passivation layer formed in a stack manner on the semiconductor substrate, with the bonding pads being exposed from the first and second passivation layers; a first metallic layer formed on each of the bonding pads and covering a portion of the second passivation layer surrounding each of the bonding pads; a third passivation layer applied on the second passivation layer and having a plurality of openings for exposing a portion of the first metallic layer, wherein each of the openings is shifted in position from a corresponding one of the bonding pads by a distance not exceeding a radius of the corresponding one of the bonding pads; a second metallic layer bonded to the first metallic layer and covering a portion of the third passivation layer surrounding the exposed portion of the first metallic layer; and a plurality of solder bumps bonded to the second metallic layer.

The distance ranges from one-third of the radius of the bonding pad to the radius of the bonding pad, and is preferably one-half of the radius of the bonding pad. The semiconductor substrate may be a semiconductor chip or wafer with low K dielectric layer.

The first passivation layer may be a silicon nitride layer. The second passivation layer is a dielectric layer made of, for example, benzo-cyclo-butene (BCB) or polyimide (PI). The third passivation layer is a dielectric layer or a solder mask, wherein the dielectric layer is preferably made of BCB or PI. The metallic layer or the first/second metallic layer may be an under bump metallurgy (UBM) comprising, for example, aluminum, nickel/vanadium alloy, copper and titanium.

A fabrication method of the above semiconductor device according to a preferred embodiment of the present invention comprises the steps of: forming a first passivation layer and a second passivation layer in a stack manner on a semiconductor substrate having a plurality of bonding pads, with the bonding pads being exposed from the first and second passivation layers; forming a metallic layer on each of the bonding pads, the metallic layer covering a portion of the second layer surrounding each of the bonding pads; applying a third passivation layer on the second passivation layer, and forming a plurality of openings in the third passivation layer to expose a portion of the metallic layer, wherein each of the openings is shifted in position from a corresponding one of the bonding pads by a distance not exceeding a radius of the corresponding one of the bonding pads; and forming a plurality of solder bumps on the portion of the metallic layer exposed via the openings.

The steps of forming the plurality of solder bumps on the metallic layer comprises: applying a solder mask on the third passivation layer, and forming a plurality of bump openings in the solder mask corresponding in position to the openings of the third passivation layer; filling a solder material in the bump openings of the solder mask and the openings of the third passivation layer, and performing a first reflow process on the solder material; and removing the solder mask, and performing a second reflow process to form a plurality of solder bumps. Preferably, the solder material is filled in the openings by printing.

A fabrication method of the above semiconductor device according to another preferred embodiment of the present invention comprises the steps of: forming a first passivation layer and a second passivation layer in a stack manner on a semiconductor substrate having a plurality of bonding pads, with the bonding pads being exposed from the first and second passivation layers; forming a first metallic layer on each of the bonding pads, the first metallic layer covering a portion of the second passivation layer surrounding each of the bonding pads; applying a third passivation layer on the second passivation layer, and forming a plurality of openings in the third passivation layer to expose a portion of the first metallic layer, wherein each of the openings is shifted in position from a corresponding one of the bonding pads by a distance not exceeding a radius of the corresponding one of the bonding pads; forming a second metallic layer on the first metallic layer, the second metallic layer covering a portion of the third passivation layer surrounding the exposed portion of the first metallic layer; and forming a plurality of solder bumps on the second metallic layer.

The steps of forming the plurality of solder bumps on the second metallic layer comprises: covering a solder mask on the third passivation layer; forming a plurality of bump openings in the solder mask corresponding in position to the openings of the third passivation layer; filling a solder material in the bump openings of the solder mask; removing the solder mask and a portion of the second metallic layer uncovered by the solder material, and performing a reflow process on the solder material to form a plurality of solder bumps. Preferably, the solder material is filled in the openings by plating.

As aforementioned, each of the openings of the third passivation layer is shifted in position from a corresponding one of the bonding pads by a predetermined distance, so as to allow each of the solder bumps to have a desirable contact area with the third passivation layer. Since the second passivation layer serves as a cushion to the solder bumps and the metallic layer, it provides better buffer capable of reducing stress imposed on the solder bumps and the metallic layer. Thereby, problems such as cracking of the solder bumps or delamination of the metallic layer can be effectively avoided. Further, there is no need of a RDL process in the present invention such that a parasitic capacitance problem is prevented.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

First Preferred Embodiment

Figure 1A:
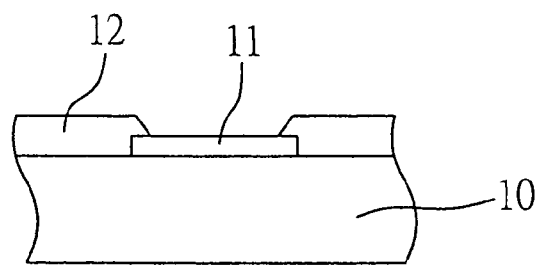
FIGS. 1A to 1E (PRIOR ART) are cross-sectional views showing the procedural steps of a conventional method for fabricating a semiconductor device.
Figure 1B:
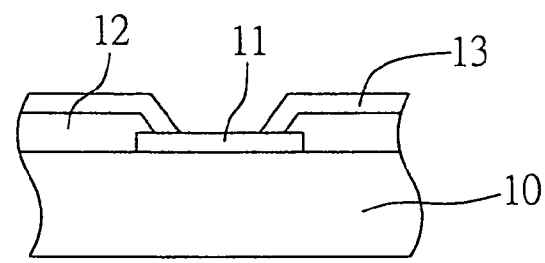
Figure 1C:
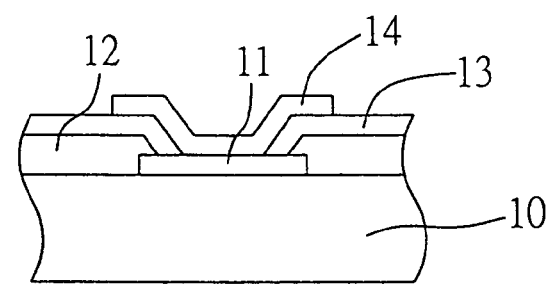
Figure 1D:
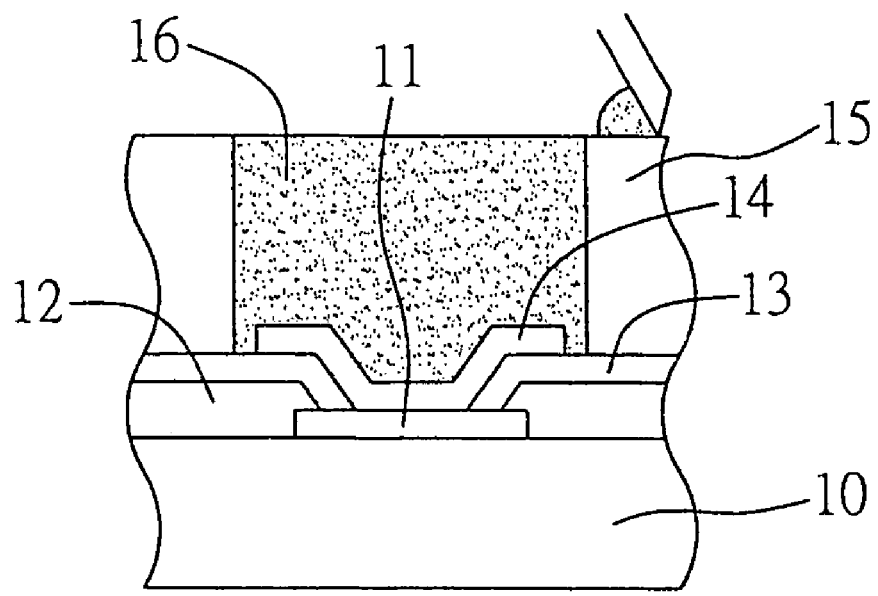
Figure 1E:
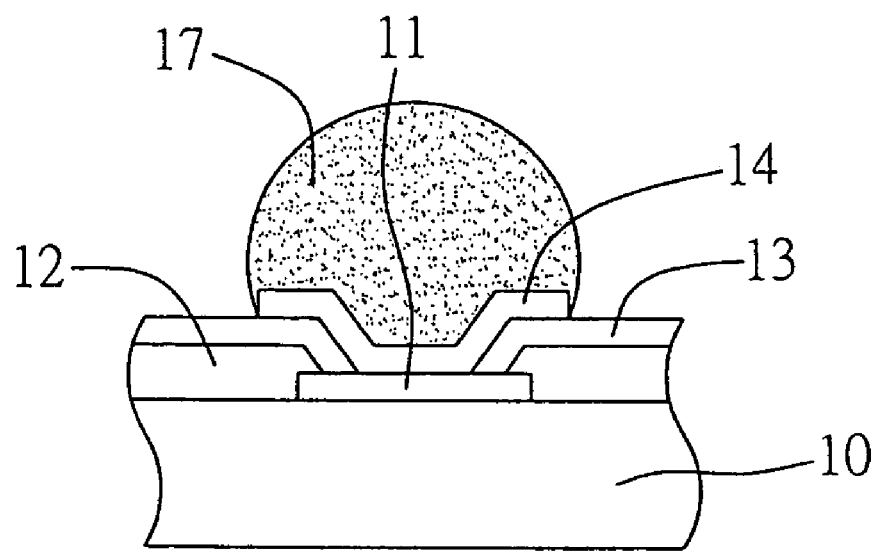
Figure 2A:
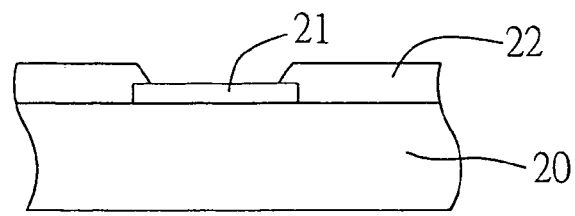
FIGS. 2A to 2F are cross-sectional views showing the procedural steps of a method for fabricating a semiconductor device according to a first preferred embodiment of the present invention.
Figure 2B:
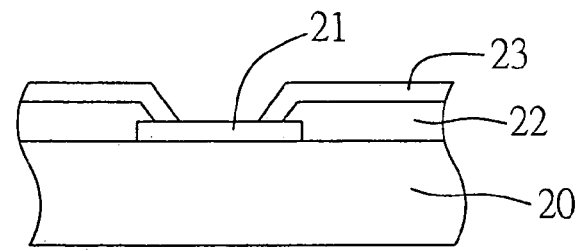
Figure 2C:
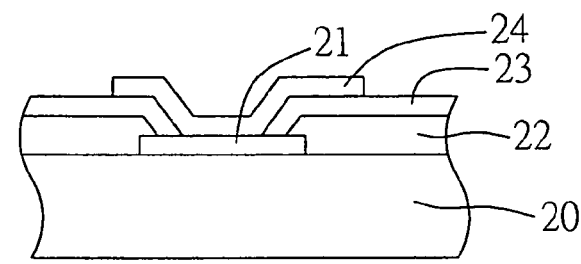
Figure 2D:
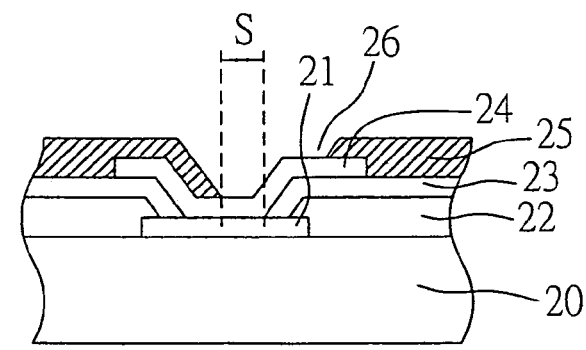
Figure 2E:
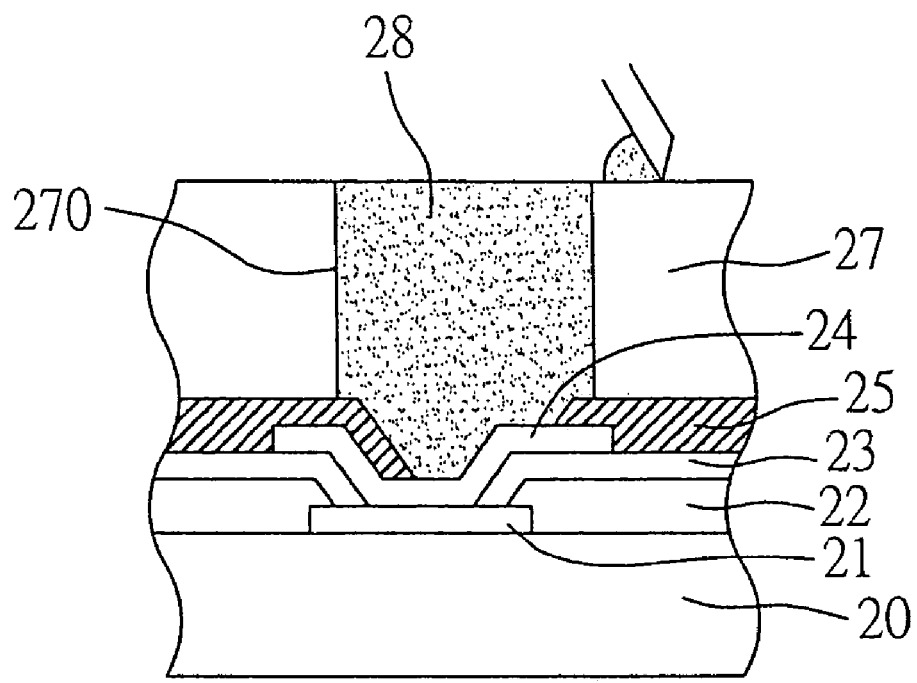
Figure 2F:
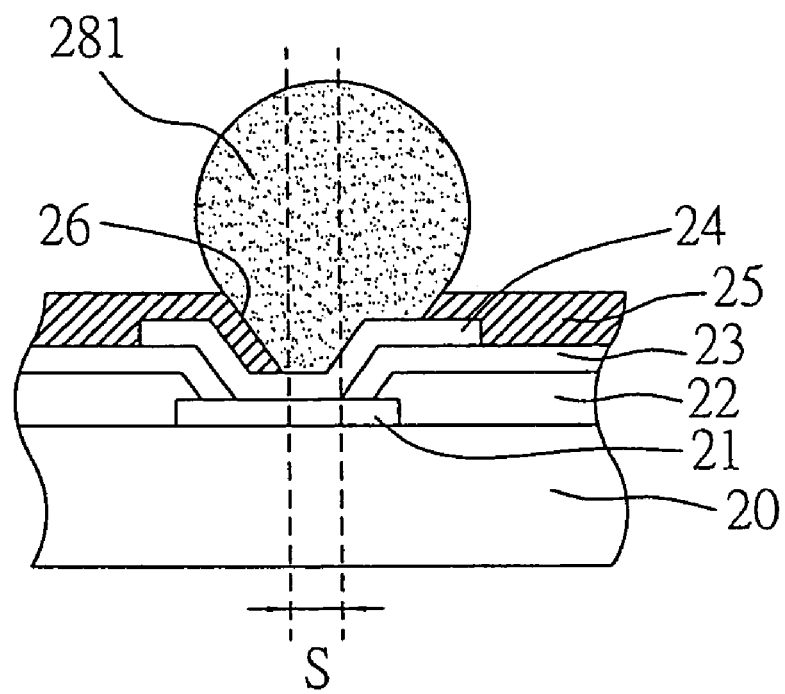

FIG. 2F shows a semiconductor device according to a first preferred embodiment of the present invention. As shown, the semiconductor device comprises a semiconductor substrate 20 having a plurality of bonding pads 21, a first passivation layer 22 formed on the semiconductor substrate 20, a second passivation layer 23 formed on the first passivation layer 22, a metallic layer 24 formed on each of the bonding pads 21, a third passivation layer 25 formed over the second passivation layer 23, and a plurality of solder bumps 281. For the purpose of simplicity, merely one solder bump is shown.

The semiconductor substrate 20 is formed on its surface with the plurality of bonding pads 21 (a single bonding pad 21 is illustrated here). Typically, the semiconductor substrate 20 may be made of silicon and is in the form of, for example, a semiconductor chip or a wafer having a plurality of chip units. The first passivation layer 22 is formed on the surface of the semiconductor substrate 20, with a predetermined portion of each of the bonding pads 21 being exposed from the first passivation layer 22. The material suitable for the first passivation layer 22 may be silicon nitride.

The second passivation layer 23 is formed on the first passivation layer 22, with the predetermined portion of each of the bonding pads 21 being exposed from the second passivation layer 23. The second passivation layer 23 may be made of benzo-cyclo-butene (BCB), polyimide (PI), or the like.

The metallic layer 24 is formed by any suitable conventional method on each of the bonding pads 21 and covers a portion of the second passivation layer 23 surrounding each of the bonding pads 21. The metallic layer 24 is, for example, a UBM that may comprise, but not limited to, aluminum, nickel/vanadium alloy, copper and titanium. It should be understood that different combinations of metals and alloys are also suitable for the metallic layer 24.

The third passivation layer 25 is formed on the second passivation layer 23, and has a plurality of openings 26 for exposing a portion of the metallic layer 24 (only one opening 26 is shown). The openings 26 are formed in a manner that, the center of each of the openings 26 is shifted in position from the center of a corresponding one of the bonding pads 21 by a distance S not exceeding a radius of the corresponding one of the bonding pads 21. The distance S can range from one-third of the radius of the bonding pad 21 to the radius of the bonding pad 21. Preferably, the distance S is one-half of the radius of the bonding pad 21. The third passivation layer 25 may be a dielectric layer or a solder mask, wherein the dielectric layer is made of, but not limited to, BCB or PI.

The solder bumps 281 are bonded to the portion of the metallic layer 24 exposed via the openings 26, and the solder bumps 281 may be made of, for example, tin/lead alloy.

The semiconductor device in the present invention has the second passivation layer 23 serving as a buffer mechanism to the solder bumps 281 and the metallic layer 24, as shown in FIG. 2F. Each of the openings 26 of the third passivation layer 25 is shifted in position from a corresponding one of the bonding pads 21 by a predetermined distance S. Such positional shift allows the solder bumps 281 bonded to the metallic layer 24 to have a sufficient interface with the third passivation layer 25, such that stress exerted to the solder bumps 281 and the metallic layer 24 can be effectively relieved by the second passivation layer 23. Thereby, problems such as cracking of the solder bumps or delamination of the metallic layer as in the prior art can be eliminated.

A fabrication method of the semiconductor device according to the first preferred embodiment of the present invention is described as follows with reference to FIGS. 2A to 2F.

Firstly, as shown in FIG. 2A, a semiconductor substrate 20 having a plurality of bonding pads 21 on a surface thereof is provided, and a first passivation layer 22 is formed on the surface of the semiconductor substrate 20, with the bonding pads 21 being exposed from the first passivation layer 22. The semiconductor substrate 20 can be a semiconductor chip or a wafer including a plurality of chip units with low K dielectric layer. The first passivation layer 22 may be a silicon nitride layer.

As shown in FIG. 2B, a second passivation layer 23 is formed on the first passivation layer 22, with the bonding pads 21 being exposed from the second passivation layer 23. The second passivation layer 23 can be made of, but not limited to, BCB or PI. Since a method for forming the passivation layers, such as spin coating, and a method for exposing the bonding pads, such as etching, are those currently available in the art, detailed description thereto is omitted herein for the purpose of simplicity.

As shown in FIG. 2C, a metallic layer 24 is formed on each of the bonding pads 21 exposed from the first and second passivation layers 22, 23, and a portion of the second passivation layer 23 surrounding each of the bonding pads 21 is also covered by the metallic layer 24. The metallic layer 24 can be a typical UBM made of aluminum, nickel/vanadium alloy, copper and titanium.

Then, as shown in FIG. 2D, a third passivation layer 25 is formed on the second passivation layer 23 and has a plurality of openings 26 formed for exposing a portion of the metallic layer 24, wherein the center of each of the openings 26 is shifted in position from the center of a corresponding one of the bonding pads 21 by a predetermined distance S not exceeding the radius of the corresponding one of the bonding pads 21. The distance S can range from one-third of the radius of the bonding pad 21 to the radius of the bonding pad 21, and preferably, the distance S is one-half of the radius of the bonding pad 21. The third passivation layer 25 can be a dielectric layer or a solder mask, wherein the dielectric layer is made of, but not limited to, BCB or PI.

Next, as shown in FIG. 2E, a solder mask 27 such as a dry film is applied over the third passivation layer 25, and the solder mask 27 is formed with a plurality of bump openings 270 corresponding in position to the openings 26 of the third passivation layer 25. Then, a solder material 28 such as tin/lead alloy is filled by a printing process in the bump openings 270 of the solder mask 27 and the openings 26 of the third passivation layer 25. A first reflow process is performed on the solder material 28 to firmly bond the solder material 28 to the metallic layer 24. It should be noted that besides printing, the solder material 28 can also be filled by a conventional plating or deposition method.

Finally, as shown in FIG. 2F, the solder mask 27 is removed, and a second reflow process is performed on the solder material 28 so as to form a plurality of solder bumps 281. This completes fabrication of the semiconductor device according to the first preferred embodiment of the present invention.

Although the third passivation layer 25 and the solder mask 27 are described in separate steps in this embodiment, it should be understood that the third passivation layer 25 and the solder mask 27 can be formed simultaneously, that is, they can be integrated into a single step. Alternatively, a single solder mask can be formed and a plurality of bump openings are defined therethrough in a manner that the solder bumps are allowed to have an increased interface with the solder mask.

Compared with the conventional re-passivation method, the semiconductor device and the fabrication method thereof in the present invention can provide the solder bumps and the metallic layer with better buffer by shifting the openings of the third passivation layer in position with respect to the corresponding bonding pads. The positional shift of the openings can thus allow the second passivation layer to offer buffer effect, thereby preventing cracking of the solder bumps and delamination of the metallic layer. Compared with the conventional RDL process, the fabrication method in the present invention is simpler to implement and lower in costs. Moreover, there is no parasitic capacitance concern existing in the present invention.

Second Preferred Embodiment

Figure 3A:
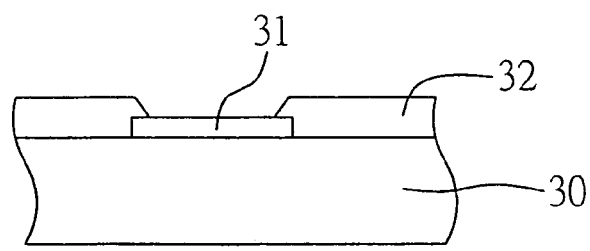
FIGS. 3A to 3G are cross-sectional views showing the procedural steps of a method for fabricating a semiconductor device according to a second preferred embodiment of the present invention.
Figure 3B:
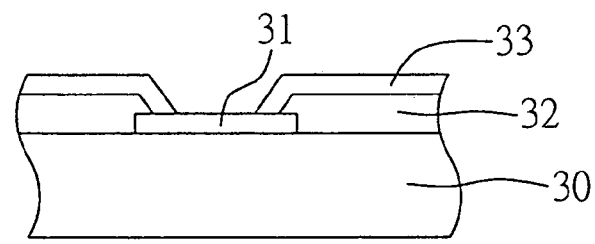
Figure 3C:
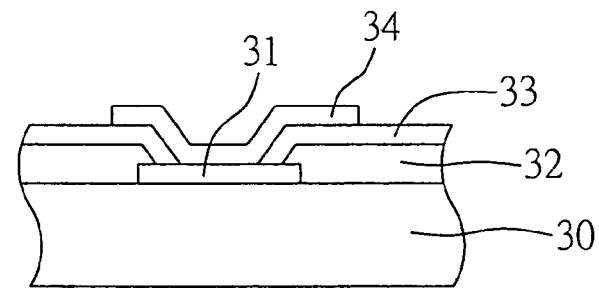
Figure 3D:
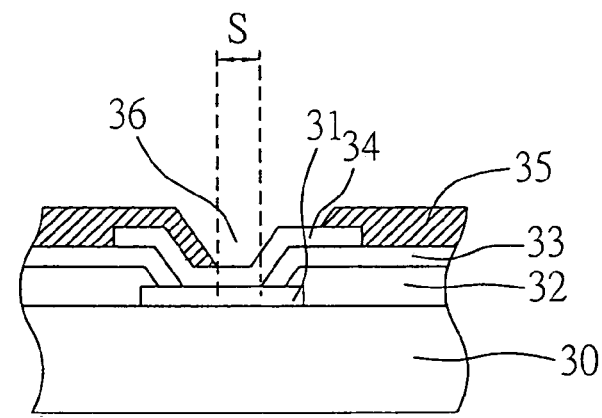
Figure 3E:
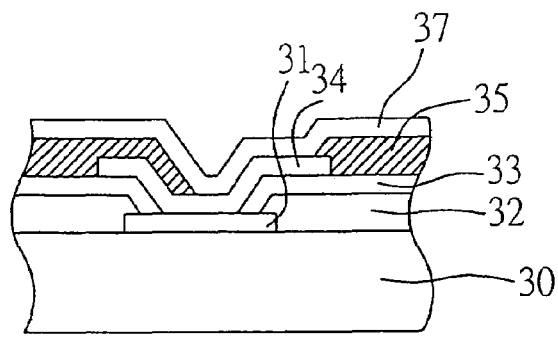
Figure 3F:
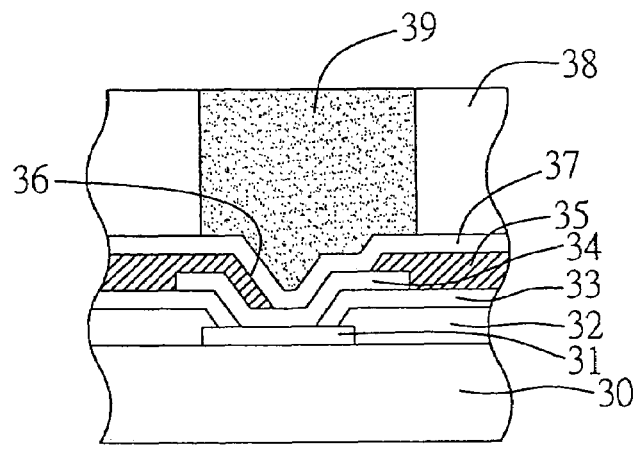
Figure 3G:
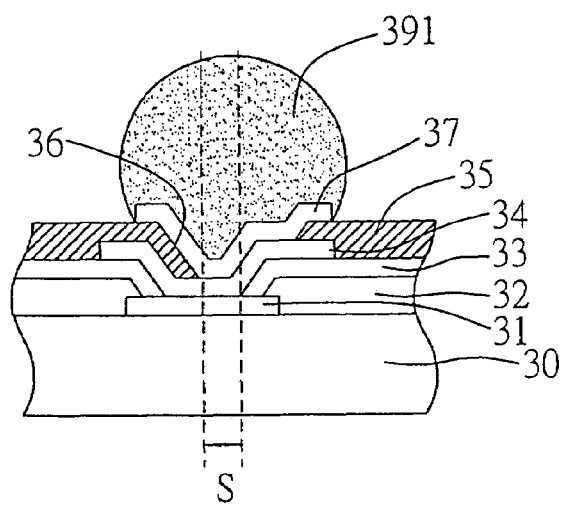

Referring to FIG. 3G, a semiconductor device according to a second preferred embodiment of the present invention comprises a semiconductor substrate 30 having a plurality of bonding pads 31, a first passivation layer 32 formed on the semiconductor substrate 30, a second passivation layer 33 formed on the first passivation layer 32, a first metallic layer 34 formed on each of the bonding pads 31, a third passivation layer 35 formed on the second passivation layer 33, a second metallic layer 37, and a plurality of solder bumps 391 bonded to the second metallic layer 37. Compared with the first preferred embodiment, the semiconductor device of the second embodiment is structurally similar to that of the first embodiment except that, in the second embodiment, a second metallic layer 37 is additionally provided and the solder bumps 391 are bonded to the second metallic layer 37 by a plating method.

In this embodiment, the center of each of openings 36 formed in the third passivation layer 35 is similarly shifted in position from the center of a corresponding one of the bonding pads 31 by a predetermined distance S not exceeding a radius of the corresponding one of the bonding pads 31. Therefore, the second metallic layer 37 is allowed to have a desirable contact area with the third passivation layer 35 disposed between the first metallic layer 34 and the second metallic layer 37. By this structural arrangement, the stress exerted to the solder bumps 391, the second metallic layer 37, and the first metallic layer 34 can be effectively reduced via the third passivation layer 35. It further allows the use of a dielectric material with low K dielectric layer for the second passivation layer 33.

A fabrication method of the above semiconductor device according to the second preferred embodiment of the present invention is described as follows with reference to FIGS. 3A to 3G. For the purpose of simplifying the description, the materials and formation processes used for the structural elements similar to those described in the first embodiment will not be repeated hereafter.

As shown in FIG. 3A, a semiconductor substrate 30 having a plurality of bonding pads 31 (only a single bonding pad 31 is shown) is covered by a first passivation layer 32, allowing the bonding pads 31 to be exposed from the first passivation layer 32.

As shown in FIG. 3B, a second passivation layer 33 is formed on the first passivation layer 32, with the bonding pads 31 being exposed from the second passivation layer 33.

As shown in FIG. 3C, a first metallic layer 34 is formed on each of the bonding pads 31, and a portion of the second passivation layer 33 surrounding each of the bonding pads 31 is also covered by the first metallic layer 34.

Then, as shown in FIG. 3D, a third passivation layer 35 is formed on the second passivation layer 33 and has a plurality of openings 36 for exposing a portion of the first metallic layer 34, wherein the center of each of the openings 36 is shifted in position from the center of a corresponding one of the bonding pads 31 by a predetermine distance S similarly not exceeding a radius of the corresponding one of the bonding pads 31.

Next, as shown in FIG. 3E, a second metallic layer 37 is formed on the first metallic layer 34 such that the first metallic layer 34 is electrically connected to the second metallic layer 37. A portion of the third passivation layer 35 surrounding the exposed portion of the first metallic layer 34 is also covered by the second metallic layer 37.

As shown in FIG. 3F, a solder mask 38 such as a photoresist (PR) is applied over the third passivation layer 35 and is formed with a plurality of bump openings 380 corresponding in position to the openings 36 of the third passivation layer 35. A solder material 39 such as tin/lead alloy is filled in the bump openings 380 of the solder mask 38 by plating. Then, the solder mask 38 and a portion of the second metallic layer 37 uncovered by the solder material 39 are removed by etching using the solder material 39 as a mask. Finally, as shown in FIG. 3G, a reflow process is performed on the solder material 39 to thereby form a plurality of solder bumps 391.

The invention has been described using exemplary preferred embodiments. However, it is to be understood that the scope of the invention is not limited to the disclosed embodiments. On the contrary, it is intended to cover various modifications and similar arrangement. The scope of the claims therefore should be accorded the broadest interpretation so as to encompass all such modifications and similar arrangements.

What is claimed is:

1. A semiconductor device comprising:
   a semiconductor substrate having a plurality of bond pads;
   a first passivation layer and a second passivation layer stacked on the semiconductor substrate, allowing the bonding pads to be exposed from the first and second passivation layers;
   a metallic layer formed on each of the bonding pads and covering a portion of the second passivation layer surrounding each of the bonding pads;

a third passivation layer applied on the second passivation layer and having a plurality of openings for exposing a portion of the metallic layer, wherein each of the openings is shifted in position from a corresponding one of the bonding pads by a distance not exceeding a radius of the corresponding one of the bonding pads; and a plurality of solder bumps bonded to the portion of the metallic layer exposed via the openings.

2. The semiconductor device of claim 1, wherein the distance ranges is from one-third of the radius of the bonding pad to the radius of the bonding pad.

3. The semiconductor device of claim 1, wherein the distance is one-half of the radius of the bonding pad.

4. The semiconductor device of claim 1, wherein the semiconductor substrate is a wafer with low K dielectric layer.

5. The semiconductor device of claim 1, wherein the second passivation layer is a dielectric layer made of benzo-cyclo-butene or polyimide.

6. The semiconductor device of claim 1, wherein the metallic layer comprises an under bump metallurgy.

7. The semiconductor device of claim 1, wherein the metallic layer comprises aluminum, nickel/vanadium alloy, copper, and titanium.

8. A semiconductor device comprising:
a semiconductor substrate having a plurality of bonding pads;
a first passivation layer and a second passivation layer stacked on the semiconductor substrate, allowing the bonding pads to be exposed from the first and second passivation layers;
a first metallic layer bonded to each of the bonding pads and covering a portion of the second passivation layer surrounding each of the bonding pads;
a third passivation layer applied on the second passivation layer and having a plurality of openings for exposing a portion of the first metallic layer, wherein each of the openings is shifted in position from a corresponding one of the bonding pads by a distance not exceeding a radius of the corresponding one of the bonding pads;
a second metallic layer bonded to the first metallic layer and covering a portion of the third passivation layer surrounding the exposed portion of the first metallic layer; and
a plurality of solder bumps bonded to the second metallic layer.

9. The semiconductor device of claim 8, wherein the distance ranges from one-third of the radius of the bonding pad to the radius of the bonding pad.

10. The semiconductor device of claim 8, wherein the distance is one-half of the radius of the bonding pad.

11. The semiconductor device of claim 8, wherein the semiconductor substrate is a wafer with low K dielectric layer.

12. The semiconductor device of claim 8, wherein the second passivation layer is a dielectric layer made of benzo-cyclo-butene or polyimide.

13. The semiconductor device of claim 8, wherein the first/second metallic layer comprises an under bump metallurgy.

14. The semiconductor device of claim 8, wherein the first/second metallic layer comprises aluminum, nickel/vanadium alloy, copper, and titanium.

* * * * *